United States Patent [19]

Sasaki

[11] 4,348,803
[45] Sep. 14, 1982

[54] PROCESS FOR PRODUCING A SEMICONDUCTOR DEVICE HAVING AN IDENTIFICATION MARK IN AN INSULATING SUBSTRATE

[75] Inventor: Nobuo Sasaki, Kawasaki, Japan

[73] Assignee: Fujitsu Limited, Kawasaki, Japan

[21] Appl. No.: 156,372

[22] Filed: Jun. 4, 1980

[30] Foreign Application Priority Data

Jun. 4, 1979 [JP] Japan .................................. 54-69798

[51] Int. Cl.³ ...................... H01L 21/66; H01L 21/84
[52] U.S. Cl. ..................................... 29/574; 156/601;
156/626; 250/548; 250/557; 250/568;
250/492.2; 235/469; 235/491; 340/146.3 B;
340/146.3 Z; 356/402; 427/10
[58] Field of Search ................... 29/574; 156/601, 626;
427/8–10; 250/548, 557, 568, 491, 492 A;
235/454, 469, 488, 491; 356/400–402;
340/146.3 B, 146.3 Z

[56] References Cited

U.S. PATENT DOCUMENTS

| | | | |
|---|---|---|---|
| 3,513,320 | 5/1970 | Weldon | 235/469 X |
| 3,679,497 | 7/1972 | Handy et al. | 156/626 |
| 3,710,101 | 1/1973 | O'Keeffe et al. | 250/311 |
| 4,037,969 | 7/1977 | Feldman et al. | 356/401 |
| 4,105,926 | 8/1978 | Reno et al. | 250/568 X |
| 4,125,418 | 11/1978 | Vinton | 156/626 X |
| 4,200,393 | 4/1980 | Suzuki et al. | 356/400 X |
| 4,202,491 | 5/1980 | Suzuki | 235/491 |
| 4,203,799 | 5/1980 | Sugawara et al. | 427/10 X |

OTHER PUBLICATIONS

Denning, P. A., "Automatic Alignment . . . Wafer Fabrication" Solid State Technology, May 1976, pp. 43–47.

Primary Examiner—L. Dewayne Rutledge
Assistant Examiner—W. G. Saba
Attorney, Agent, or Firm—Staas & Halsey

[57] ABSTRACT

In a process for producing a semiconductor device using an insulating substrate, a so called SOS device, a semiconductor layer is formed on the insulating film and semiconductor elements are formed in the semiconductor layer, material, which develops color with in the insulating substrate, is introduced in the substrate, and a color developed part of the insulating substrate is used as an identification mark of the substrate and the semiconductor elements. Cracking of the substrates due to formation of the identification mark is prevented.

23 Claims, 5 Drawing Figures

PROCESS FOR PRODUCING A SEMICONDUCTOR DEVICE HAVING AN IDENTIFICATION MARK IN AN INSULATING SUBSTRATE

BACKGROUND OF THE INVENTION

The present invention relates to a process for producing a semiconductor device using an insulating substrate, such as a sapphire substrate.

The term sapphire is generally used in semiconductor engineering to indicate $\alpha$(alpha)-$Al_2O_3$ and is also used herein according to the same general meaning.

In the production of semiconductor devices, such as SOS (silicon on sapphire) devices using sapphire substrates, each sapphire substrate should be identified in the production steps of the semiconductor devices, such as an epitaxial growth step or oxidation step of a silicon layer. Identification has previously been performed by engraving a mark, such as numerals, on the sapphire substrates using, for example, a diamond tool. Since sapphire has a low resistance to rapid heating and cooling, the sapphire substrates are liable to crack if they are rapidly heated or cooled. In the production of the semiconductor devices, the sapphire substrates are, therefore, slowly heated to, for example, the epitaxial growth temperature and slowly cooled from such a temperature, so as to prevent cracking of the sapphire substrates. Although the sapphire substrates are carefully heated and cooled in the production of the semiconductor devices, cracking frequently occurs due to the grooves of the identification mark.

Since it is difficult and expensive to identify the conventional identification marks by an optical instrument, the identification of the sapphire substrates has conventionally been manually performed, which is a disadvantage of the conventional marking process.

The conventional process for forming semiconductor elements in a semiconductor layer, which is formed on an insulating substrate, such as in an SOS structure, is complicated and control of the process is difficult due to manual marking.

SUMMARY OF THE INVENTION

It is an object of the present invention to form semiconductor elements in a semiconductor layer, which is formed on an insulating substrate, while achieving a high production yield of semiconductor devices.

It is another object of the present invention to provide an identification mark, by which mark control of the process for forming semiconductor elements in a semiconductor layer, which is formed on an insulating substrate, is easily carried out.

It is a further object of the present invention to provide a process for marking an insulating substrate without forming grooves on the insulating substrate, thereby preventing cracking of the insulating substrate due to the grooves.

It is still another object of the present invention to provide a marking process, the marks of said process being suitable for automatic identification of the insulating substrate.

In accordance with the objects of the present invention, there is provided a process for producing a semiconductor device having an insulating substrate, a semiconductor layer formed on the insulating substrate and semiconductor elements formed in the semiconductor layer, comprising the steps of:

selectively introducing into the insulating substrate material which develops color in the insulating substrate, and;

forming said semiconductor elements using the color-developed part of the insulating substrate as an identification mark.

The material mentioned above may be chromium (Cr) or titanium (Ti). When such material is doped into the insulating substrate, for example, a sapphire substrate, which is colorless and transparent, color develops in the sapphire substrate. When chromium is doped into the sapphire substrate in a concentration ranging from 0.01 through 3 molar%, red color is developed. The $\alpha$-$Al_2O_3$ having the red color is referred to in jewelry terminology as ruby. When titanium is doped into the sapphire substrate in a concentration in the range of 0.1 through 0.2 molar%, blue color is developed. The $\alpha$-$Al_2O_3$ having the blue color is referred to in jewelry terminology as sapphire. The material, such as chromium and titanium, can be introduced into the insulating substrate by using a known technique and apparatus such as ion implantation under the condition of acceleration energy of from, for example, 50 to 150 KeV and a dosing amount of from, for example, $5 \times 10^{15}$ to $2 \times 10^{16}$ $cm^{-3}$. An annealing is carried out so as to restore the crystal structure of the sapphire substrate as it was prior to the ion implantation and hence develop the color of the ion implanted material. The annealing temperature is preferably from 800° through 1200° C. Thus, an advantage of the present invention is that cracking of the sapphire substrates due to the formation of grooves does not occur.

Another advantage of the present invention is that the identification mark is easily formed automatically, the marking of the sapphire substrates is accurate and quick as compared with the prior manual art, in which the marking has been performed by means of a diamond tool.

In one embodiment of the present invention, the annealing mentioned above is performed simultaneously with heating of the sapphire substrate for an epitaxial growth of a semiconductor layer on the sapphire substrate. In SOS devices, a semiconductor silicon layer is formed by an epitaxial growth on a sapphire substrate which is heated to a temperature of for example 950° C. It is therefore possible in this embodiment to eliminate the necessity of performing a heating step independently from the conventional production steps of the SOS devices.

In another embodiment of the present invention, the material, which can develop color in the sapphire substrate, is ion-implanted into the sapphire substrate through an epitaxial semiconductor film formed on the sapphire substrate. Since the thickness of the epitaxial semiconductor film is usually 1 micron or less and hence very thin, the material is ion-implanted into the sapphire substrate through the film and the colored identification mark can be detected through the film.

In another embodiment of the present invention, a binary identification mark is marked by selectively forming at least one spot on a predetermined peripheral portion of the sapphire substrate.

The present invention is explained in detail with reference to FIGS. 1 through 5, wherein.

Figure 1:
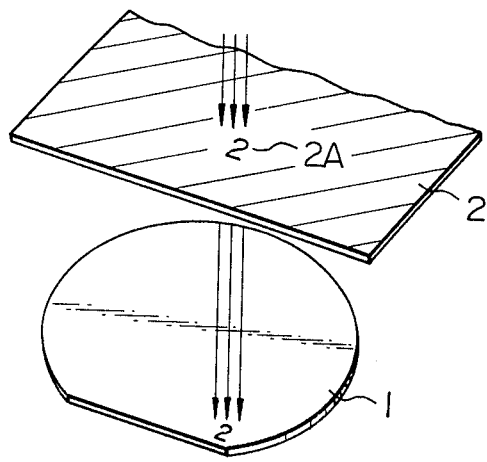
FIG. 1 illustrates a marking process of a sapphire substrate.

Referring to FIG. 1, a mask 2 is located between the sapphire substrate 1 having a thickness of from 300 to 400 microns and an ion-implanting source (not shown) of the material to be introduced. The mask 2 is provided with an aperture 2A of the identification mark pattern which is the numeral 2 in the sapphire substrate 1. The periphery of the sapphire substrate 1 is partly straight and partly circular, and the straight peripheral part is referred to, in semiconductor engineering, as the facet. The sapphire substrate 1 and the mask 2 are positioned other in such a manner that the aperture 2A of the identification mark pattern is located above the facet portion of the sapphire substrate. Ions of material, such as chromium and titanium, are implanted through the aperture 2A of the identification mark pattern, as illustrated by arrows, onto the surface part of the sapphire substrate. The length and width of the identification mark can be from 7 through 10 mm, each so that the mark can be easily read by the naked eye. The acceleration energy of the ions is 100 KeV and the dosing amount is $1 \times 10^{16}/cm^2$. After the ion implantation, the sapphire substrate is annealed at a temperature of 1200° C. in a furnace for a period of approximately one hour so as to develop the color pattern which is of the same shape as the aperture 2A of the identification pattern. Laser annealing can also be used instead of heating in the furnace.

Figure 2:
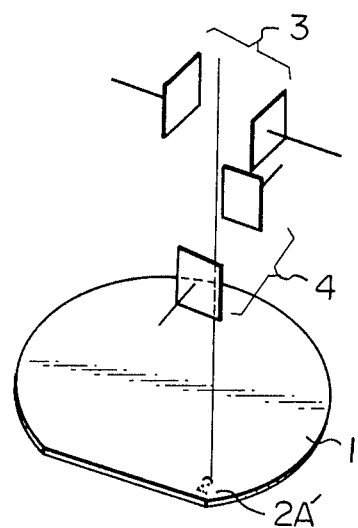
FIG. 2 illustrates another marking process.

Referring to FIG. 2, the ion beam indicated by the arrow line is thinly stopped down, deflected and displaced by the X electrode 3 and the Y electrode 4 of a deflection system so as to directly delineate the identification mark 2A' on the sapphire substrate 1. The sapphire substrate 1 is then annealed so as to develop the colored pattern 2A' of the identification mark.

Figure 3:
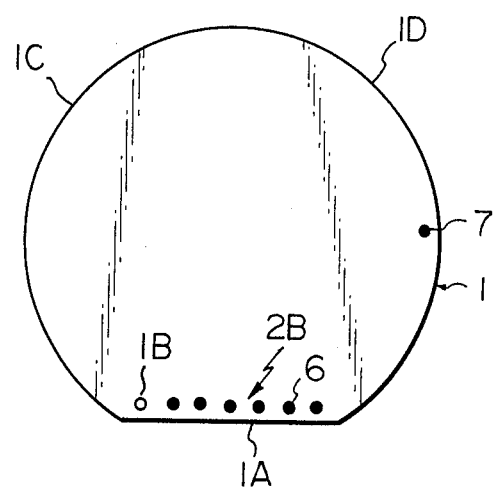
FIG. 3 illustrates an identification mark of a sapphire substrate.

In FIG. 3, an identification mark, which is suitable for automatic identification of the sapphire substrates, is illustrated. The identification mark 2B is made of six spots 6 and there are seven predetermined positions 1B, on which the spots can be selectively formed. Depending upon the existence or non-existence of the spots 6 at such positions 1B, the binary identification mark is created, and hence, $2^7$ (128) sapphire substrates can be distinguished from each other by the identification mark illustrated in FIG. 3. This identification mark is suitable for automatic identification, because the mark is binary and consists of spot(s), and further, the spot(s) is formed on the predetermined positions of the sapphire substrate 1. It is preferable to form such spots at a position adjacent the peripheral portion of the sapphire substrate 1, because SOS devices formed on the peripheral portion do not satisfy the physical requirements and hence are not used. In addition, it is preferable to form the identification mark along the facet 1A of the sapphire substrate 1. If necessary, a numerical, or alphabetical, or other mark can be used in combination with the binary mark.

In the production of SOS devices, the first (front) surface of the sapphire substrates, on which the silicon expitaxial film is formed, is always directed upwards. In a case where a supporting plate of the sapphire substrates is turned upside down and the substrates are scattered by accident, it may become unclear whether the first or second (rear) surface of a substrate is directed upwards. Since the spot marks cannot provide correct information when observed from the second surface, it is advisable to form one colored spot 7 at either of the circular sides 1C and 1D on the first side of each sapphire substrate, so that they can be identified as such even if accidentally scattered.

Figure 4:
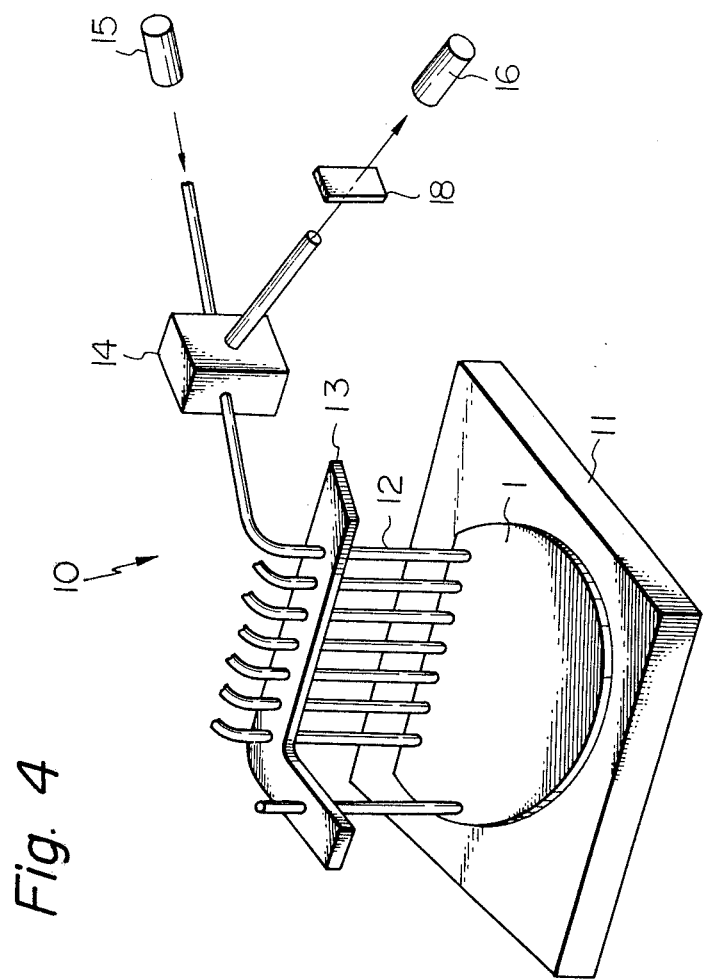

Referring to FIG. 4, a decoding device or the binary identification mark is generally denoted by reference numeral 10. The sapphire substrate 1 provided with binary identification mark (not shown) is stationarily placed on a supporting plate 11 at a predetermined position of the supporting plate 11. The decoding device 10 is provided with eight optical fibers 12 which are secured to and protrude through a securing plate 13. The securing plate 13 or the supporting plate 11 is displaced, so that the optical fibers 12 are positioned directly above the predetermined positions of the sapphire substrate 1 where the spots are selectively formed. Each of the optical fibers 12 is connected via a semi-transparent mirror system 14 to a light emitting system 15, such as a light emitting diode (LED), and to a photo cell 16. For the sake of brevity, the semi-transparent mirror system 14, the light emitting system 15 and the photo cell 16 connected to only one of the optical fibers are illustrated in FIG. 4. Reference numeral 18 indicates a filter for passing the light reflected from the spots and having the wave length of the color of the doped impurities. The photo cells 16 are connected to a logic circuit (not shown) for decoding the binary identification mark.

Figure 5:
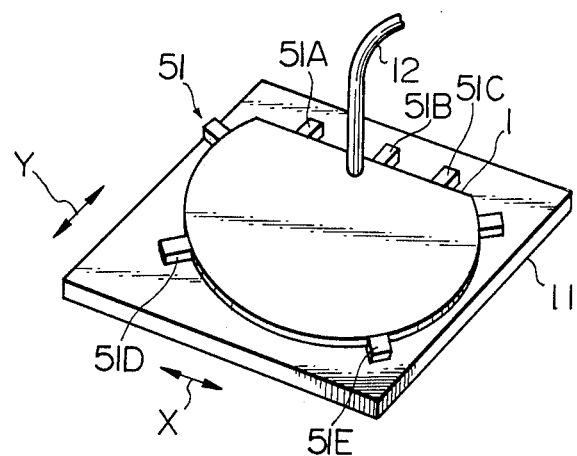
FIGS. 4 and 5 are a schematic elevational view of a decoding device of the identification mark.

In FIG. 5, one of the single optical fibers 12 is adjustably positioned above the sapphire substrate 1 by displacing the supporting plate 11 in the X and Y directions. It is also possible to decode the identification mark by displacing the optical fibers 12 along the peripheral portion substrate 1. The supporting plate 11 is provided with positioning claws 51 of the sapphire. Of the positioning claws 51, the claws 51A, 51B and 51C in contact with the facet of the sapphire substrate 1 are stationary while the two claws 51D and 51E in contact with the circular side of the sapphire substrate are movable. The sapphire substrate is therefore positioned by displacing the substrate so that it is in contact with the stationary claws 51A, 51B and 51C and, then, pushing the substrate by the two movable claws 51D and 51E.

According to the decoding device illustrated in FIGS. 4 and 5, no manual operation is required for the identification of the sapphire substrates. It is therefore possible to automatically identify the sapphire substrates and also to prevent the contamination of the sapphire substrates due to manual handling.

The control of the process for producing the semiconductor devices is carried out using the identification mark at the step after the formation of such mark until the completion of the semiconductor devices, including the steps of forming a semiconductor layer on the sapphire substrate and forming semiconductor elements in the semiconductor layer. The sapphire substrates are marked by different identification marks in accordance with, for example, different electrical characteristics of the semiconductor elements to be produced and different production lots of the semiconductor devices. By the aid of such identification marks, the processes of forming an insulating film and a conductor lead, as well as introduction of impurities into a semiconductor layer, are controlled. That is, since the kind and thickness of the insulating film and conductor leads, as well as the condition for introducing impurities into the semiconductor layer, are varied depending on the electrical properties mentioned above, the parameters of the process, such as temperature, time, flow rate of gases for forming the insulating film and conductor leads or for introducing impurities, are adjusted after the identification of the sapphire substrates. In the case where, with regard to a plurality of sapphire substrates, the electrical properties of semiconductor elements are identical but the production lines or apparatuses of these elements are not identical, the process for producing these elements is controlled by marking the sapphire substrates treated in the same line or apparatus with the same identification mark. The results of producing the semiconductor elements, such as production recovery, in one of the lines and apparatuses can be analyzed using the identification mark and, then, a feed back based on the analysis is made so as to improve the production conditions in this line or apparatus. In addition, when such an accident as contamination of the sapphire substrates occurs in one of the lines or apparatuses, it is possible to detect by the identification marks which lots treated in such line or apparatus have been subject to the accident.

The sapphire substrates are distributed into the production lines or production apparatuses, so that the substrates having a predetermined identification mark are treated in a predetermined line or apparatus. In order to perform such distribution automatically, an optical detecting device of the identification mark located directly before the production lines or apparatuses and a central processing unit (CPU), for example a microcomputer, connected to the optical detecting device, can be used. In accordance with the automatic process control explained hereinabove, it is possible to enhance the production yield and to decrease the variance of quality of semiconductor devices.

Although sapphire substrates are explained hereinabove as an example of the insulating substrates, spinel, which is mainly composed of alumina, can be used as the insulating substrates in the present invention.

I claim:

1. A process for producing a semiconductor device having a identification mark in an insulating substrate, said device including a semiconductor layer formed on said insulating substrate and semiconductor elements formed in said semiconductor layer, said process comprising the steps of:
    selecting said insulating substrate to be of sapphire or spinel;
    ion implanting a selected material into a selected part of said insulating substrate, said selected material comprising chromium or titanium; and
    completing the formation of said semiconductor device, wherein
    a selected one of said steps of ion implanting and completing the device formation includes a heating of said substrate for developing said identification mark.

2. The process according to claim 1, wherein said semiconductor layer comprises silicon.

3. The process according to claim 1, wherein, during said ion implanting said selected material, said insulating substrate is heated to develop said color.

4. The process according to claim 3, wherein said heating provides heating for epitaxial growth of said semiconductor layer on the insulating substrate.

5. The process according to claim 3, wherein said heating is performed after an epitaxial growth of said semiconductor layer on said insulating substrate.

6. The process according to claim 1, wherein said selected part comprises a surface portion of said insulating substrate adjacent the periphery thereof.

7. The process according to claim 6, wherein the identification mark comprises at least one spot.

8. The process according to claim 7, wherein said identification mark comprises a binary coded series of spots.

9. The process according to claim 6, wherein said identification mark comprises at least one alphabetical letter.

10. The process of claim 6, wherein said selected material is introduced at at least one selected position of one surface of the insulating substrate, so as to enable identification of the front and rear surfaces of the insulating substrate.

11. The process according to claim 1, wherein said semiconductor elements have electrical properties that are identified by said identification mark.

12. The process according to claim 1, wherein said semiconductor device is produced in production lots that are respectively identified by said identification mark.

13. The process according to claim 1, wherein said semiconductor device is produced in production lines and on apparatuses that are respectively identified by said identification mark.

14. The process of claim 1, wherein said identification mark is optically detected.

15. The process of claim 14, wherein said controlling of the process is performed using a central processing unit connected to an optical detecting device for reading the identification mark.

16. The process of claim 1 or 2 wherein an epitaxial semiconductor film is formed on said substrate and said material is introduced by ion-implantation through said semiconductor film.

17. The process of claim 1 or 2 wherein said ion implantation comprises ion acceleration energy in the range from $50$ to $150$ KeV and a dosing amount of from $5 \times 10^{15}$ to $2 \times 10^{16}/cm^2$.

18. The process of claim 1 or 2, said chromium being doped into said sapphire substrate in a concentration of 0.1 to 3% molar.

19. The process of claim 1 or 2, said titanium being doped into said sapphire substrate in a concentration from 0.1 to 0.2%.

20. The process of claim 1, wherein one of the length and width of said identification mark is from 7 to 10 millimeters.

21. The process of claim 1, wherein said insulating substrate is heated at a temperature of 1200° C. for a period in the range of one hour to develop said identification mark.

22. The process of claim 18, wherein said insulating substrate is heated at a temperature of 1200° C. for a period in the range of one hour to develop said identification mark.

23. The process of claim 19, wherein said insulating substrate is heated at a temperature of 1200° C. for a period in the range of one hour to develop said identification mark.

* * * * *

UNITED STATES PATENT AND TRADEMARK OFFICE
CERTIFICATE OF CORRECTION

PATENT NO. : 4,348,803

DATED : 14 September 1982

INVENTOR(S) : NUBUO SASAKI

It is certified that error appears in the above-identified patent and that said Letters Patent is hereby corrected as shown below:

Col. 4, line 6, "or" should be --for--;
line 36, delete "of the sapphire".

Signed and Sealed this

Twenty-second Day of February 1983

[SEAL]

Attest:

GERALD J. MOSSINGHOFF

Attesting Officer          Commissioner of Patents and Trademarks